United States Patent
Yang et al.

(10) Patent No.: US 11,953,350 B2
(45) Date of Patent: Apr. 9, 2024

(54) CAPACITANCE DETECTION APPARATUS AND ELECTRONIC DEVICE

(71) Applicant: SHENZHEN GOODIX TECHNOLOGY CO., LTD., Shenzhen (CN)

(72) Inventors: Ming Yang, Shenzhen (CN); Shuqing Cheng, Shenzhen (CN); Dansheng Chen, Shenzhen (CN); Zicheng Guo, Shenzhen (CN)

(73) Assignee: SHENZHEN GOODIX TECHNOLOGY CO., LTD., Shenzhen (CN)

( * ) Notice: Subject to any disclaimer, the term of this patent is extended or adjusted under 35 U.S.C. 154(b) by 841 days.

(21) Appl. No.: 17/033,258

(22) Filed: Sep. 25, 2020

(65) Prior Publication Data
US 2021/0018339 A1      Jan. 21, 2021

Related U.S. Application Data

(63) Continuation of application No. PCT/CN2019/108636, filed on Sep. 27, 2019.

(30) Foreign Application Priority Data

Jul. 16, 2019 (CN) .......................... 201921117878.8

(51) Int. Cl.
*G01D 5/241* (2006.01)
*G06F 3/044* (2006.01)

(52) U.S. Cl.
CPC ......... *G01D 5/2417* (2013.01); *G06F 3/0443* (2019.05); *G06F 3/0446* (2019.05)

(58) Field of Classification Search
CPC ...... G01D 5/2417; G01D 5/24; G06F 3/0443; G06F 3/0446; H03K 2017/9613;
(Continued)

(56) References Cited

U.S. PATENT DOCUMENTS

| | | | |
|---|---|---|---|
| 9,081,431 B2 * | 7/2015 | Kung | ..................... G06F 3/0445 |
| 2005/0179415 A1 * | 8/2005 | Nakano | ................... E05F 15/46 |
| | | | 318/478 |

(Continued)

FOREIGN PATENT DOCUMENTS

| | | |
|---|---|---|
| CN | 101261552 A | 9/2008 |
| CN | 101261558 A | 9/2008 |

(Continued)

*Primary Examiner* — Tung X Nguyen
*Assistant Examiner* — Robert P Alejnikov, Jr.
(74) *Attorney, Agent, or Firm* — Emerson, Thomson & Bennett, LLC; Roger D. Emerson; Matt J. Wilson

(57) ABSTRACT

A capacitance detection apparatus and an electronic device are disclosed. The capacitance detection apparatus includes: a sensing module, a connecting circuit, and a differential detection circuit for detecting changes in capacitance of the sensing module; the sensing module comprises: a substrate, and a first sensing layer and a second sensing layer respectively located on two sides of the substrate; a first sensing unit of the first sensing layer is opposite to a second sensing unit of the second sensing layer, and the first sensing unit covers the second sensing unit; the first sensing unit and the second sensing unit are electrically connected to the differential detection circuit. When a detection object approaches the capacitance detection apparatus, the capacitance of the first sensing unit is influenced by the temperature and the detection object, and the capacitance of the second sensing unit is only influenced by the temperature.

18 Claims, 6 Drawing Sheets

(58) Field of Classification Search
CPC ...... H03K 2217/960725; H03K 2217/960745; H03K 2217/960765; H03K 17/955; H04R 1/1041; H04R 1/10; G01R 31/64; G01R 19/32; G01R 27/2605
USPC ........................................ 324/661, 679, 686
See application file for complete search history.

(56) References Cited

U.S. PATENT DOCUMENTS

| | | | |
|---|---|---|---|
| 2010/0231530 A1* | 9/2010 | Lin ......................... | G06F 3/045 |
| | | | 345/173 |
| 2012/0182250 A1* | 7/2012 | Nagata .................. | G06F 3/0446 |
| | | | 345/173 |
| 2015/0145537 A1* | 5/2015 | Flanagan ........... | H03K 17/9622 |
| | | | 324/686 |
| 2016/0224158 A1* | 8/2016 | Young ................. | G06F 3/04186 |
| 2020/0288241 A1* | 9/2020 | Song .................... | H04R 1/1033 |

FOREIGN PATENT DOCUMENTS

| | | | | |
|---|---|---|---|---|
| CN | 202632259 U | * | 12/2012 | |
| CN | 202632259 U | | 12/2012 | |
| CN | 103475352 A | * | 12/2013 | |
| CN | 103475352 A | | 12/2013 | |
| CN | 103765235 A | * | 4/2014 | ............ G01B 7/023 |
| CN | 104516597 A | | 4/2015 | |
| DE | 102018211024 A1 | * | 6/2019 | |
| KR | 20040044689 | | 5/2004 | |
| KR | 1020150061584 | | 6/2015 | |
| WO | WO-2018176199 A1 | * | 10/2018 | ............ G06F 3/041 |

* cited by examiner

CAPACITANCE DETECTION APPARATUS AND ELECTRONIC DEVICE

CROSS REFERENCE TO RELATED APPLICATIONS

This application is a continuation of International Application No. PCT/CN2019/108636, filed on Sep. 27, 2019, which claims the priority of Chinese patent application No. 201921117878.8, filed in Chinese Patent Office on Jul. 16, 2019, and entitled "CAPACITANCE DETECTION APPARATUS AND ELECTRONIC DEVICE", the entire contents of which are herein incorporated by reference.

TECHNICAL FIELD

Embodiments of the present disclosure relate to the field of sensor technology, and particularly to a capacitance detection apparatus and an electronic device.

BACKGROUND

The development of electronic devices is increasingly rapid. In order to improve user experience, human-computer interaction is more intelligent, for example, touch operation, intelligent detection, etc., all realize human-computer interaction by detecting the contact between the human body and the device. Among the solutions of detecting the contact between the human body and the device, capacitive sensors are more widely used because of their easy installation and low costs.

However, because the capacitive sensors are affected by temperatures when detecting human contact, the detection results of the capacitive sensors are inaccurate.

SUMMARY

In view of this, one of the technical problems solved by the embodiments of the present disclosure is to provide a capacitance detection apparatus and an electronic device to overcome the defect in the prior art that the detection results of capacitive sensors are inaccurate because the capacitive sensors are affected by temperatures.

An embodiment of the present disclosure provides a capacitance detection apparatus, including: a sensing module, a connecting circuit, and a differential detection circuit for detecting changes in capacitance of the sensing module;
the sensing module includes: a substrate, and a first sensing layer and a second sensing layer respectively located on two sides of the substrate,
a first sensing unit of the first sensing layer is opposite to a second sensing unit of the second sensing layer, and the first sensing unit covers the second sensing unit;
the first sensing unit and the second sensing unit are electrically connected to the differential detection circuit through the connecting circuit, respectively.

Optionally, in an embodiment of the present disclosure, the first sensing unit includes a first pattern, the second sensing unit includes a second pattern, and the first pattern and the second pattern are in the same shape.

Optionally, in an embodiment of the present disclosure, the first pattern and the second pattern are both grid patterns, a grid size of the first pattern is the same as a grid size of the second pattern, or the grids of the second pattern are sparser than the grids of the first pattern.

Optionally, in an embodiment of the present disclosure, the first sensing unit and the second sensing unit are both copper foil layers.

Optionally, in an embodiment of the present disclosure, the connecting circuit is arranged on one or two sides of the substrate.

Optionally, in an embodiment of the present disclosure, the first sensing layer is provided with a first ground pattern, and/or the second sensing layer is provided with a second ground pattern.

Optionally, in an embodiment of the present disclosure, the connecting circuit includes a connector, and the connector includes a first connecting point, a second connecting point, and a ground point;
the first sensing unit is electrically connected to the differential detection circuit through the first connecting point and the second sensing unit is electrically connected the differential detection circuit through the second connecting point;
the first ground pattern is electrically connected to the ground point, and/or the second ground pattern is electrically connected to the ground point.

Optionally, in an embodiment of the present disclosure, the first sensing layer further includes a first protection element, the second sensing layer further includes a second protection element, and the first protection element and the second protection element are both conductive media;
the first protection element is not in contact with the first sensing unit, and the second protection element is not in contact with the second sensing unit.

Optionally, in an embodiment of the present disclosure, the first protection element is arranged around the first sensing unit of the first sensing layer, and the second protection element is arranged around the second sensing unit of the second sensing layer.

Optionally, in an embodiment of the present disclosure, the first protection element and the second protection element are opposite to each other, and are of a same size and shape.

Optionally, in an embodiment of the present disclosure, the capacitance detection apparatus further includes a cover plate, and the cover plate is fixed on the first sensing layer by rubber.

Optionally, in an embodiment of the present disclosure, the capacitance detection apparatus further includes a third protection element, the cross sections of the first sensing layer, the second sensing layer and the third protection element are annular, and the third protection element is fixed inside of the second sensing layer.

Optionally, in an embodiment of the present disclosure, the capacitance detection apparatus further includes a ground layer;
the cross section of the substrate is spiral, a part of the substrate that is close to an inner side of the spiral is between the third protection element and the ground layer, and a part of the substrate that is close to an outer side of the spiral is between the first sensing layer and the second sensing layer.

Optionally, in an embodiment of the present disclosure, the capacitance detection apparatus further includes an excitation circuit;
the first sensing unit and the second sensing unit are electrically connected with the excitation circuit through the connecting circuit respectively, and the excitation circuit is configured to transmit electrical signals to the first sensing unit and the second sensing unit.

Optionally, in an embodiment of the present disclosure, the capacitance detection apparatus further includes a control logic circuit and a switch module;

the first sensing unit and the second sensing unit are electrically connected to the switch module through the connecting circuit respectively, and the switch module is electrically connected to the excitation circuit and the differential detection circuit respectively;

the control logic circuit is electrically connected to the switch module, and the control logic circuit is configured to control a turn-on or turn-off of the switch module.

Optionally, in an embodiment of the present disclosure, the switch module includes a first switch and a second switch;

the first switch is connected between the first sensing unit and the differential detection circuit, and the control logic circuit is configured to control the first sensing unit to be connected with the excitation circuit, or control the first sensing unit to be connected with the differential detection circuit through the first switch;

the second switch is connected between the second sensing unit and the differential detection circuit, and the control logic circuit is configured to control the second sensing unit to be connected with the excitation circuit, or control the second sensing unit to be connected with the differential detection circuit through the second switch.

Optionally, in an embodiment of the present disclosure, the differential detection circuit includes a first operational amplifier, a first analog-to-digital converter, a first capacitor, and a second capacitor;

a positive input terminal of the first operational amplifier is electrically connected to the first switch, and a negative input terminal of the first operational amplifier is electrically connected to the second switch;

the first capacitor is connected between the positive input terminal of the first operational amplifier and an output terminal of the first operational amplifier, the second capacitor is connected between the negative input terminal of the first operational amplifier and the output terminal of the first operational amplifier, and the output terminal of the first operational amplifier is electrically connected to the first analog-to-digital converter.

Optionally, in an embodiment of the present disclosure, the switch module includes a third switch, a fourth switch, and a fifth switch;

the third switch is connected between the first sensing unit and a first connecting terminal, and the control logic circuit is configured to control the first sensing unit to be connected with the first connecting terminal, or control the first sensing unit to be grounded through the third switch;

the fourth switch is connected between the second sensing unit and the first connecting terminal, and the control logic circuit is configured to control the second sensing unit to be connected with the first connecting terminal, or control the second sensing unit to be grounded through the fourth switch;

the fifth switch is connected between the first connecting terminal and the differential detection circuit, and the control logic circuit is configured to control the first connecting terminal to be connected with the excitation circuit, or control the first connecting terminal to be connected with the differential detection circuit through the fifth switch.

Optionally, in an embodiment of the present disclosure, the differential detection circuit includes a second operational amplifier, a second analog-to-digital converter, and a third capacitor;

a positive input terminal of the second operational amplifier is connected to a reference voltage, and a negative input terminal of the second operational amplifier is electrically connected to the fifth switch;

the third capacitor is connected between the negative input terminal of the second operational amplifier and an output terminal of the second operational amplifier, and the output terminal of the second operational amplifier is electrically connected with the second analog-to-digital converter.

An embodiment of the present disclosure provides an electronic device, including the capacitance detection apparatus as described in any embodiment of the present disclosure.

Optionally, in an embodiment of the present disclosure, the electronic device is an earphone, and the sensing module of the capacitance detection apparatus is arranged around a speaker of the earphone.

The first sensing layer of the sensing module is arranged on the side close to the user, and the second sensing layer of the sensing module is arranged on the side facing away from the user.

Optionally, in an embodiment of the present disclosure, the substrate is formed into a laminated structure by encircling the speaker twice.

Optionally, in an embodiment of the present disclosure, the length of the first sensing unit of the first sensing layer and the length of the second sensing unit of the second sensing layer are smaller than or equal to the perimeter of the speaker.

Optionally, in an embodiment of the present disclosure, the third protection element of the capacitance detection apparatus is on the outside of the ground layer of the capacitance detection apparatus, and a length of the ground layer being surrounded by the third protection element is the perimeter of the speaker.

In the embodiment of the present disclosure, the first sensing unit is arranged on the first sensing layer of the capacitance detection apparatus, and the second sensing unit is arranged on the second sensing layer of the capacitance detection apparatus. During detection, when a detection object approaches the capacitance detection apparatus, the capacitance of the first sensing unit is influenced by the temperature and the detection object, and the capacitance of the second sensing unit is only influenced by the temperature. Through the capacitances of the first sensing unit and the second sensing unit, the influence of temperature can be eliminated, the changes in capacitance caused by the detection object can be determined, and the detection accuracy of the capacitance detection apparatus can be improved.

BRIEF DESCRIPTION OF THE DRAWINGS

Some specific embodiments of the present disclosure are described in detail hereinafter in an exemplary manner instead of a non-limitative manner with reference to the accompanying drawings. In the drawings, like reference numerals denote like or similar parts or elements. A person skilled in the art should understand that these drawings are not necessarily drawn to scale. In the figures.

DETAILED DESCRIPTION OF EMBODIMENTS

The implementation of any technical solution of the embodiments of the present disclosure does not necessarily achieve all the above advantages at the same time.

The following further describes specific implementations of the embodiments of the present disclosure with reference to the accompanying drawings.

Embodiment 1

Figure 1:
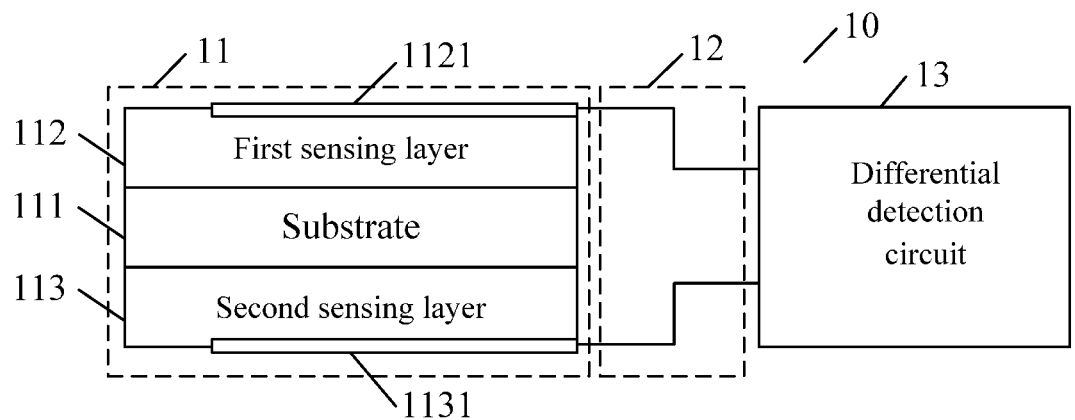
FIG. 1 is a schematic structural diagram of a capacitance detection apparatus according to an embodiment of the present disclosure.

A first embodiment of the present disclosure provides a capacitance detection apparatus 10, as shown in FIG. 1, which is a schematic structural diagram of a capacitance detection apparatus 10 according to an embodiment of the present disclosure. The capacitance detection apparatus 10 includes:

a sensing module 11, a connecting circuit 12, and a differential detection circuit 13 for detecting changes in capacitance of the sensing module 11;

The sensing module 11 includes: a substrate 111, and a first sensing layer 112 and a second sensing layer 113 respectively located on two sides of the substrate 111, A first sensing unit 1121 of the first sensing layer 112 is opposite to a second sensing unit 1131 of the second sensing layer 113, and the first sensing unit 1121 covers the second sensing unit 1131;

The first sensing unit 1121 and the second sensing unit 1131 are electrically connected to the differential detection circuit 13 through the connecting circuit 12, respectively.

It should be noted that the first sensing unit 1121 and the second sensing unit 1131 are respectively located on two sides of the substrate 111, the side where the first sensing unit 1121 is located may be the side facing the human body, and the side where the second sensing unit 1131 is located may be the side facing away from the human body. The position of the first sensing unit 1121 on a first side of the substrate 111 is the same as the position of the second sensing unit 1131 on a second side of the substrate 111. The first sensing unit 1121 covering the second sensing unit 1131 means that, when viewed from the side of the substrate 111 where the first sensing unit 1121 is located to the side where the second sensing unit 1131 is located, the second sensing unit 1131 is hidden under the first sensing unit 1121, and the first sensing unit 1121 covers the second sensing unit 1131.

The substrate 111 may be a PCB (Printed Circuit Board) or FPC (Flexible Printed Circuit), the first sensing unit 1121 and the second sensing unit 1131 may be copper foil patterns etched on the PCB or FPC, the PCB or FPC may be at least two layers, and when the PCB or FPC is more than two layers, two of the layers are etched with patterns, and the remaining layers may be used for wiring or other purposes.

The capacitance detection apparatus 10 according to the embodiment of the present disclosure can detect whether a detection object approaches. When a detection object approaches the first sensing layer 112 of the capacitance detection apparatus 10, the capacitance of the first sensing unit 1121 is affected by the detection object. The ground capacitance value of the first sensing unit 1121 contains base capacitance of the first sensing unit 1121, base capacitance temperature drift of the first sensing unit 1121 caused by temperature, and sensing capacitance caused by the detection object. The second sensing unit 1131 far away from the detection object does not contain the sensing capacitance. The ground capacitance value of the second sensing unit 1131 contains base capacitance of the second sensing unit 1131 and base capacitance temperature drift of the second sensing unit 1131 caused by temperature. The magnitude of the sensing capacitance can be obtained by subtracting the ground capacitance value of the second sensing unit 1131 from the ground capacitance value of the first sensing unit 1121.

It should be noted that when the capacitance of the first sensing unit 1121 changes due to the influence of the detection object, the first sensing unit 1121 transmits a first detection electrical signal to the differential detection circuit 13, the second sensing unit 1131 also transmits a second detection electrical signal to the differential detection circuit 13, the differential detection circuit 13 can detect the current or voltage values of the two detection electrical signals, and the capacitance value can be calculated according to the current or voltage values. Of course, only an exemplary description is given here, other implementations are also available, and the present disclosure does not limit this. The detection electrical signals are used to indicate that the electrical signals are used to detect the capacitances of the first sensing unit 1121 and the second sensing unit 1131, and the first and second are used to distinguish two different electrical signals and do not have any limiting effect. The detection object includes an object that can change the capacitance of the first sensing unit 1121, for example, the detection object may be a human body.

Embodiment 2

Optionally, in an embodiment of the present disclosure, the first sensing unit 1121 includes a first pattern, the second sensing unit 1131 includes a second pattern, and the first pattern and the second pattern are in the same shape.

It should be noted that the same shape of the first pattern and the second pattern means that when viewed from the side of the substrate 111 where the first sensing unit 1121 is located to the side where the second sensing unit 1131 is located, the first pattern coincides with the second pattern, or the second pattern is hidden under the first pattern and covered by the first pattern.

Optionally, in an embodiment of the present disclosure, the first pattern and the second pattern are both grid patterns, a grid size of the first pattern is the same as a grid size of the second pattern, or the grids of the second pattern are sparser than the grids of the first pattern.

Optionally, in an embodiment of the present disclosure, the first sensing unit 1121 and the second sensing unit 1131 are both copper foil layers.

The first sensing unit 1121 and the second sensing unit 1131 may be copper foil layers etched on the substrate 111, and the connecting circuit 12 may also be a copper foil layer etched on the substrate 111.

Embodiment 3

Figure 2:
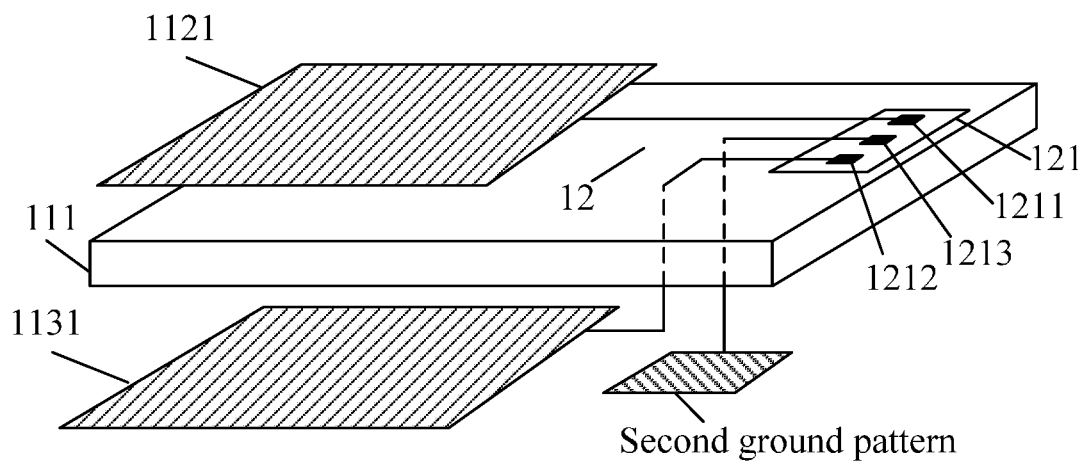
FIG. 2 is a schematic location diagram of a connecting circuit according to an embodiment of the present disclosure.

As shown in FIG. 2, FIG. 2 is a schematic location diagram of a connecting circuit 12 according to an embodiment of the present disclosure. Optionally, the connecting circuit 12 is arranged on one or two sides of the substrate 111.

For example, the side of the substrate 111 where the first sensing layer 112 is located is a first side, the side of the substrate 111 where the second sensing layer 113 is located is a second side, the branch in the connecting circuit 12 that connects the first sensing unit 1121 and the differential detection circuit 13 is a first branch, and the branch in the connecting circuit 12 that connects the second sensing unit 1131 and the differential detection circuit 13 is a second branch. In FIG. 2, the connecting circuit 12 is arranged on the first side of the substrate 111 as an example, but the present disclosure is not limited thereto.

The connecting circuit 12 may be arranged on the first side of the substrate 111; at this time, the first branch and the second branch are both on the first side of the substrate 111, the first branch may be directly connected to the first sensing unit 1121, and the second branch may pass through the substrate 111 and be connected to the second sensing unit 1131.

Alternatively, the connecting circuit 12 is arranged on the second side of the substrate 111; at this time, the first branch and the second branch are both on the second side of the substrate 111, the second branch may be directly connected to the second sensing unit 1131, and the first branch may pass through the substrate 111 and be connected to the first sensing unit 1121;

Alternatively, a part of the connecting circuit 12 is arranged on the first side of the substrate 111, and the other part is arranged on the second side of the substrate 111. Further, the first branch may be arranged on the first side of the substrate 111, and the second branch is arranged on the second side of the substrate 111.

Optionally, in an embodiment of the present disclosure, the first sensing layer 112 is provided with a first ground pattern, and/or the second sensing layer 113 is provided with a second ground pattern. The first ground pattern and the second ground pattern are used to shield interference.

As shown in FIG. 2, the second sensing layer 113 is provided with a second ground pattern as an example in FIG. 2, and the present disclosure is not limited thereto.

Optionally, in an embodiment of the present disclosure, the connecting circuit 12 includes a connector 121, and the connector 121 includes a first connecting point 1211, a second connecting point 1212, and a ground point 1213; the first sensing unit 1121 is electrically connected to the differential detection circuit 13 through the first connecting point 1211, and the second sensing unit 1131 is electrically connected to the differential detection circuit 13 through the second connecting point 1212; the first ground pattern is electrically connected to the ground point 1213, and/or the second ground pattern is electrically connected to the ground point 1213. The connector 121 is only the part of the connecting circuit 12 that is connected to the differential detection circuit 13. The connector 121 may be an independent device, or just a region containing the connecting points of the connecting circuit 12. The connecting points may be welding spots. The present disclosure does not limit the specific form of the connector 121.

Embodiment 4

Figure 3A:
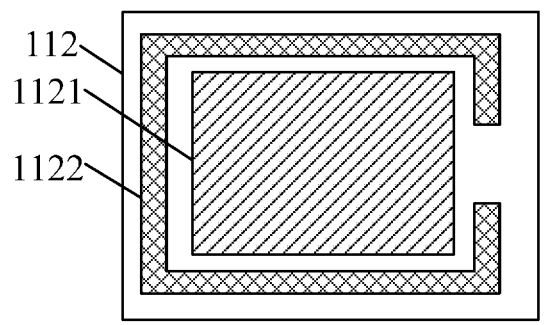
FIG. 3a is a schematic structural diagram of a first sensing layer according to an embodiment of the present disclosure.
Figure 3B:
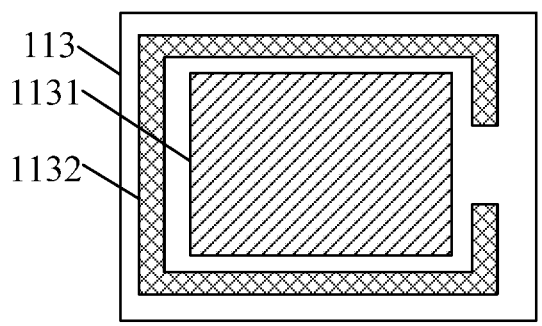
FIG. 3b is a schematic structural diagram of a second sensing layer according to an embodiment of the present disclosure.

Optionally, as shown in FIGS. 3a and 3b, FIG. 3a is a schematic structural diagram of a first sensing layer 112 according to an embodiment of the present disclosure, and FIG. 3b is a schematic structural diagram of a second sensing layer 113 according to an embodiment of the present disclosure. In an embodiment of the present disclosure, the first sensing layer 112 further includes a first protection element 1122, the second sensing layer 113 further includes a second protection element 1132, and the first protection element 1122 and the second protection element 1132 are both conductive media;

The first protection element 1122 is not in contact with the first sensing unit 1121, and the second protection element 1132 is not in contact with the second sensing unit 1131.

Optionally, in an embodiment of the present disclosure, the first protection element 1122 is arranged around the first sensing unit 1121 of the first sensing layer 112, and the second protection element 1132 is arranged around the second sensing unit 1131 of the second sensing layer 113.

Optionally, in an embodiment of the present disclosure, the first protection element 1122 and the second protection element 1132 are opposite to each other, and are of a same size and shape.

The first protection element 1122 and the second protection element 1132 are used to prevent the first sensing unit 1121 and the second sensing unit 1131 from contacting water.

Figure 4:
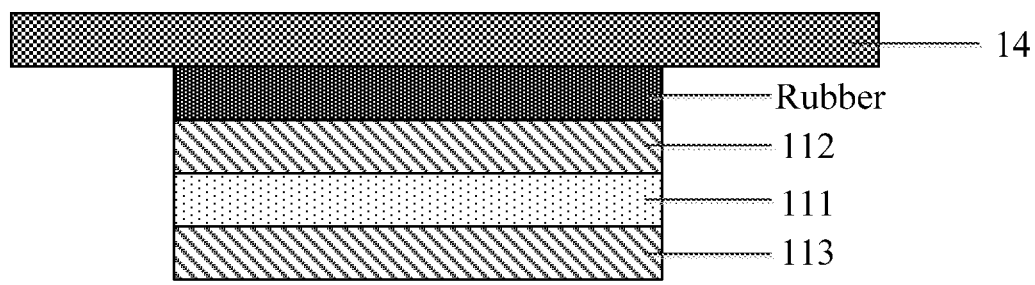
FIG. 4 is a schematic cross-sectional diagram of a capacitance detection apparatus according to an embodiment of the present disclosure.

Optionally, as shown in FIG. 4, FIG. 4 is a schematic cross-sectional diagram of a capacitance detection apparatus 10 according to an embodiment of the present disclosure. In an embodiment of the present disclosure, the capacitance detection apparatus 10 further includes a cover plate 14, and the cover plate 14 is fixed on the first sensing layer 112 by rubber.

Embodiment 5

Figure 5:
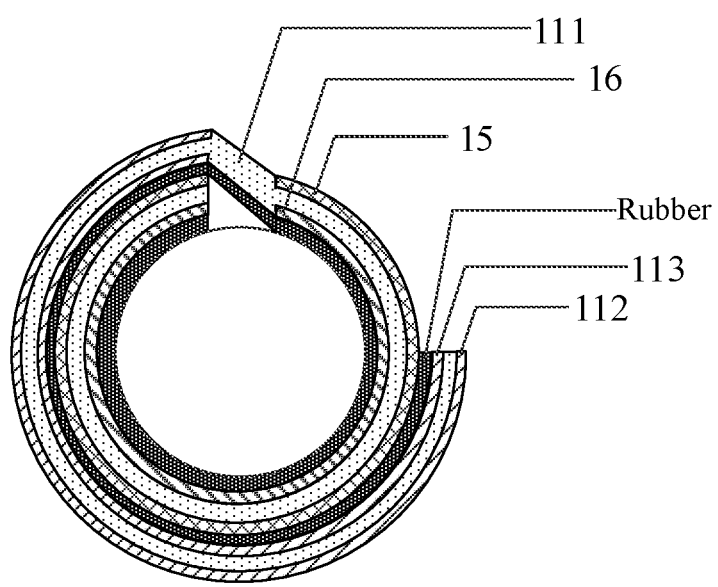
FIG. 5 is a schematic cross-sectional diagram of a differential detection circuit according to an embodiment of the present disclosure.

Optionally, as shown in FIG. 5, FIG. 5 is a schematic cross-sectional diagram of a capacitance detection apparatus 10 according to an embodiment of the present disclosure. In an embodiment of the present disclosure, the cross section of the substrate 111 is spiral, and the first sensing layer 112 and the second sensing layer 113 arranged on the substrate 111 are annular.

Optionally, in an embodiment of the present disclosure, the capacitance detection apparatus 10 further includes a third protection element 15, the cross sections of the first sensing layer 112, the second sensing layer 113 and the third protection element 15 are annular, and the third protection element 15 is fixed inside of the second sensing layer 113.

Optionally, in an embodiment of the present disclosure, the capacitance detection apparatus 10 further includes a ground layer 16; a cross section of the substrate 111 is spiral, a part of the substrate 111 that is close to an inner side of the spiral is between the third protection element 15 and the ground layer 16, and a part of the substrate 111 that is close to an outer side of the spiral is between the first sensing layer 112 and the second sensing layer 113.

Embodiment 6

Figure 6:
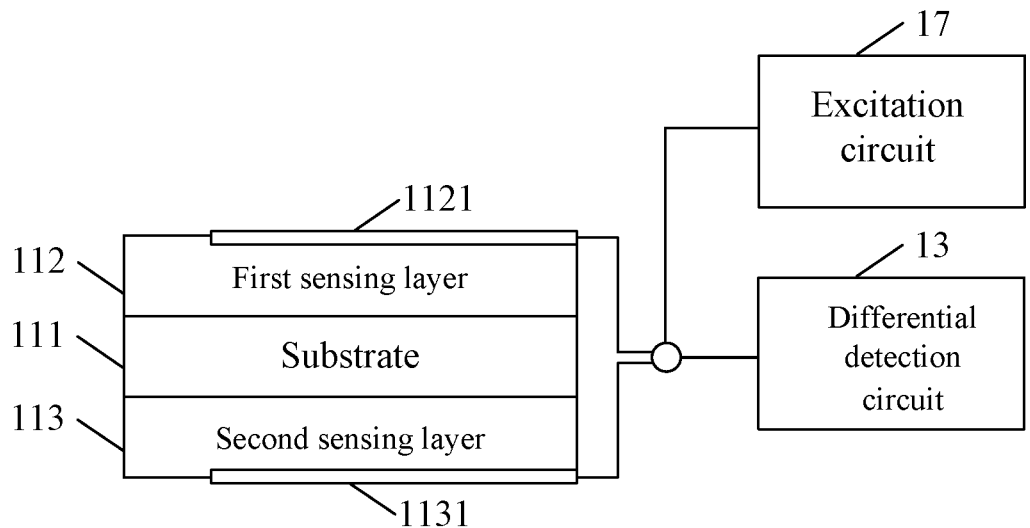
FIG. 6 is a schematic structural diagram of a capacitance detection apparatus according to an embodiment of the present disclosure.

Optionally, as shown in FIG. 6, FIG. 6 is a schematic structural diagram of a capacitance detection apparatus 10 according to an embodiment of the present disclosure. In an embodiment of the present disclosure, the capacitance detection apparatus 10 further includes an excitation circuit 17;

The first sensing unit 1121 and the second sensing unit 1131 are electrically connected to the excitation circuit 17 respectively, and the excitation circuit 17 is configured to transmit electrical signals to the first sensing unit 1121 and the second sensing unit 1131.

The excitation circuit 17 provides electrical signals for excitation to the first sensing unit 1121 and the second sensing unit 1131, and charges the first sensing unit 1121 and the second sensing unit 1131, so that the first sensing unit 1121 and the second sensing unit 1131 transmit detection electrical signals to the differential detection circuit 13.

Embodiment 7

Figure 7:
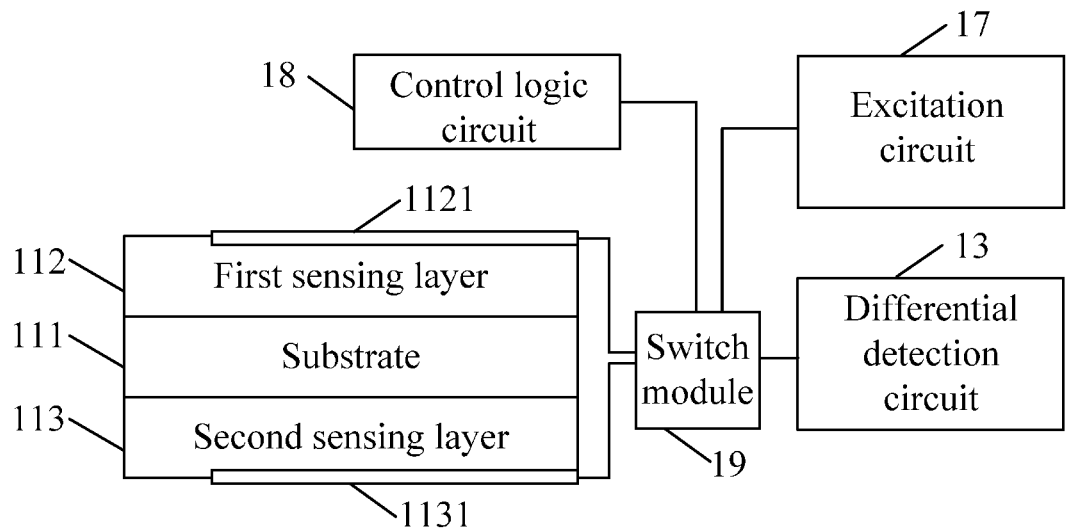
FIG. 7 is a schematic structural diagram of a capacitance detection apparatus according to an embodiment of the present disclosure.

Optionally, as shown in FIG. 7, FIG. 7 is a schematic structural diagram of a capacitance detection apparatus 10 according to an embodiment of the present disclosure. In an embodiment of the present disclosure, the capacitance detection apparatus 10 further includes a control logic circuit 18 and a switch module 19;

The first sensing unit 1121 and the second sensing unit 1131 are electrically connected to the switch module 19 respectively, and the switch module 19 is electrically connected to the excitation circuit 17 and the differential detection circuit 13 respectively;

The control logic circuit 18 is electrically connected to the switch module 19, and the control logic circuit 18 is configured to control a turn-on or turn-off of the switch module 19.

It should be noted that, by controlling the turn-on or turn-off of the switch module 19, the first sensing unit 1121 and the second sensing unit 1131 can be controlled to be connected with or disconnected from the excitation circuit 17, and the first sensing unit 1121 and the second sensing unit 1131 can also be controlled to be connected with or disconnected from the differential detection circuit 13. In an implementation manner, the first sensing unit 1121 and the second sensing unit 1131 can only be connected with the excitation circuit 17 or, or connected with the differential detection circuit 13, but cannot be connected with the excitation circuit 17 and the differential detection circuit 13 at the same time. When the first sensing unit 1121 and the second sensing unit 1131 are connected with the excitation circuit 17, the excitation circuit 17 provides the first sensing unit 1121 and the second sensing unit 1131 with electrical signals for excitation. When the first sensing unit 1121 and the second sensing unit 1131 are connected with the differential detection circuit 13, the first sensing unit 1121 transmits a first detection electrical signal to the differential detection circuit 13, and the second sensing unit 1131 transmits a second detection electrical signal to the differential detection circuit 13.

In a specific disclosure scenario, the first sensing unit 1121 and the second sensing unit 1131 may be copper foil layers, the first sensing unit 1121 may form a capacitor to the ground, and the second sensing unit 1131 may form a capacitor to the ground. When the sensing module 11 is connected to the excitation circuit 17, the excitation circuit 17 charges the capacitors, then the excitation circuit 17 is disconnected from the sensing module 11, and the sensing module 11 is connected with the differential detection circuit 13. At this time, the capacitors transfer charges to the differential detection circuit 13, and the differential detection circuit 13 hereby detects the changes in capacitance of the sensing module 11.

The control logic circuit 18 may control the switch module 19 in many implementation manners. Here, three specific implementation manners are listed. Of course, they are only exemplary descriptions, and the present disclosure is not limited thereto.

Figure 8:
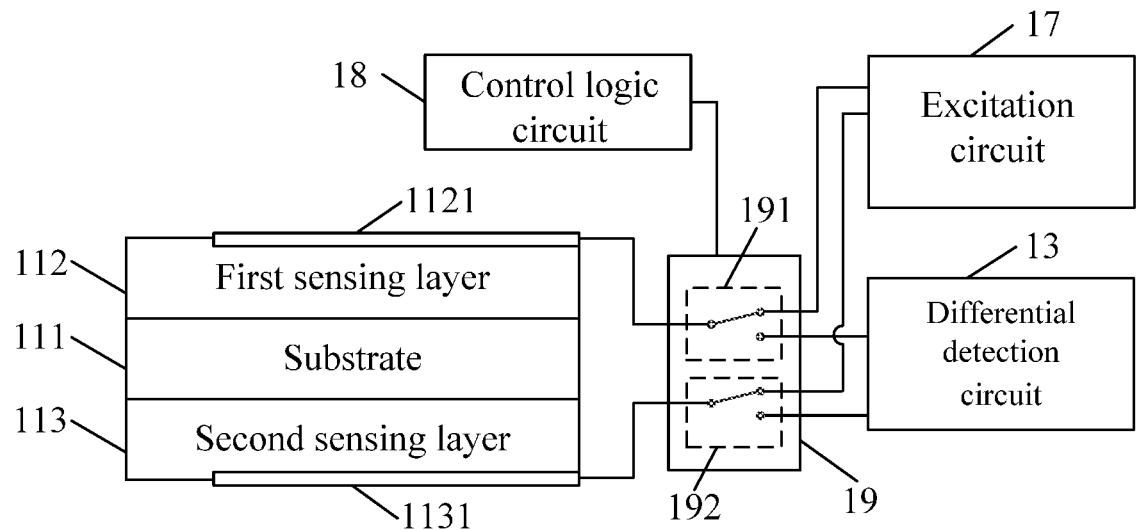
FIG. 8 is a schematic structural diagram of a capacitance detection apparatus according to an embodiment of the present disclosure.

In the first implementation manner, as shown in FIG. 8, FIG. 8 is a schematic structural diagram of a capacitance detection apparatus 10 according to an embodiment of the present disclosure. The switch module 19 includes a first switch 191 and a second switch 192;

The first switch 191 is connected between the first sensing unit 1121 and the differential detection circuit 13, and the control logic circuit 18 is configured to control the first sensing unit 1121 to be connected with the excitation circuit 17, or control the first sensing unit 1121 to be connected with the differential detection circuit 13 through the first switch 191;

The second switch 192 is connected between the second sensing unit 1131 and the differential detection circuit 13, and the control logic circuit 18 is configured to control the second sensing unit 1131 to be connected with the excitation circuit 17, or control the second sensing unit 1131 to be connected with the differential detection circuit 13 through the second switch 192.

The control on the first switch 191 and the second switch 192 by the control logic circuit 18 may be preset, and the control logic circuit 18 may periodically control the first switch 191 and the second switch 192. Of course, the first switch 191 and the second switch 192 may be one switch, or a combination of several switches to achieve the same effect. For example, taking the first switch 191 as an example, the first switch 191 may be a switch for switching a circuit, to connect the first sensing unit 1121 and the excitation circuit 17, or to connect the first sensing unit 1121 and the differential detection circuit 13. For another example, the first switch 191 may include two sub-switches, one sub-switch controls the connection or disconnection between the first sensing unit 1121 and the excitation circuit 17, and the other sub-switch controls the connection or disconnection between the first sensing unit 1121 and the differential detection circuit 13.

Figure 9:
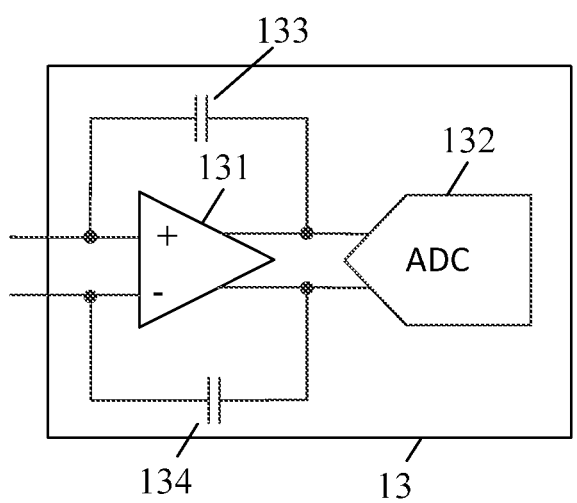
FIG. 9 is a schematic structural diagram of a differential detection circuit according to an embodiment of the present disclosure.

Optionally, in combination with the foregoing first implementation manner, as shown in FIG. 9, FIG. 9 is a schematic structural diagram of a differential detection circuit 13 according to an embodiment of the present disclosure. The differential detection circuit 13 includes a first operational amplifier 131, a first analog-to-digital converter (ADC) 132, a first capacitor 133 and a second capacitor 134;

A positive input terminal of the first operational amplifier 131 is electrically connected to the first switch 191, and a negative input terminal of the first operational amplifier 131 is electrically connected to the second switch 192;

The first capacitor 133 is connected between the positive input terminal of the first operational amplifier 131 and an output terminal of the first operational amplifier 131, the second capacitor 134 is connected between the negative input terminal of the first operational amplifier 131 and the output terminal of the first operational amplifier 131, and the output terminal of the first operational amplifier 131 is electrically connected to the first ADC 132.

The differential detection circuit 13 shown in FIG. 9 is a true differential detection circuit 13. The first operational amplifier 131 receives the first detection electrical signal transmitted by the first sensing unit 1121 through the positive input terminal, and receives the second detection electrical signal transmitted by the second sensing unit 1131 through the negative input terminal. The first operational amplifier 131 calculates the capacitance difference between the first sensing unit 1121 and the second sensing unit 1131 according to the current value or voltage value of the first detection electrical signal, and the current value or voltage value of the second detection electrical signal, thus obtaining the value of the sensing capacitance.

The capacitance detection apparatus 10 shown in FIG. 8 may be a true differential detection circuit 13. The first switch 191 and the second switch 192 are both connected to the excitation circuit 17 in the capacitor charging phase. In the detection phase, the first switch 191 and the second switch 192 code in turn. The first switch 191 is connected to the differential detection circuit 13 and then disconnected once, which is referred to as one coding, that is, the first switch 191 and the second switch 192 are connected with or disconnected from the differential detection circuit 13 in turn. When the first switch 191 is connected with the differential detection circuit 13, the capacitor formed by the first sensing unit 1121 and the ground transfers charges to the differential detection circuit 13. When the second switch 192 is connected with the differential detection circuit 13, the capacitor formed by the second sensing unit 1131 and the ground transfers charges to the differential detection circuit 13. The differential detection circuit 13 can detect changes in capacitance of the first sensing unit 1121 and the second sensing unit 1131 in the sensing module 11 through the charges transferred by the capacitors.

Figure 10:
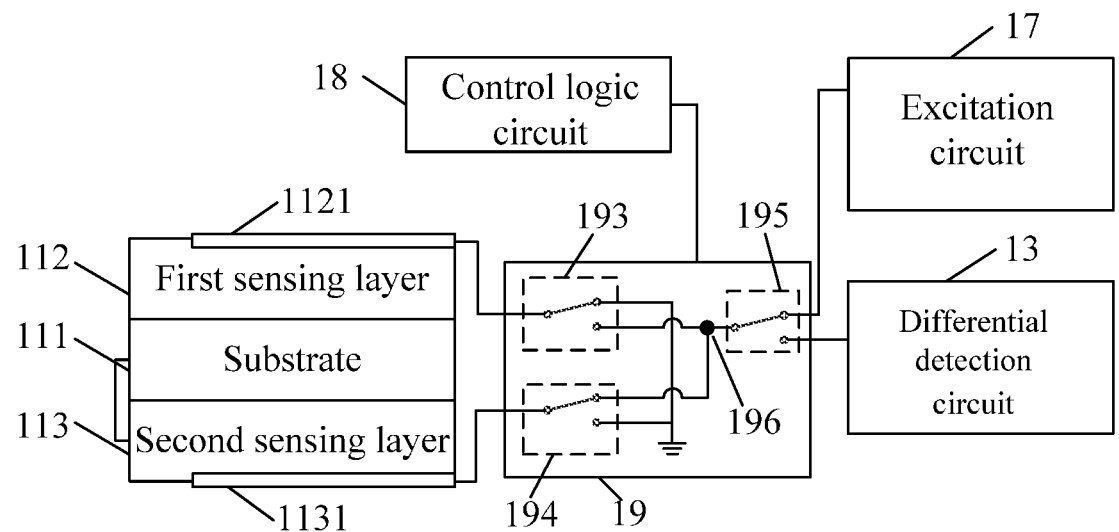
FIG. 10 is a schematic structural diagram of a capacitance detection apparatus according to an embodiment of the present disclosure.

FIG. 10 is a schematic structural diagram of a capacitance detection apparatus 10 according to an embodiment of the present disclosure. The switch module 19 includes a third switch 193, a fourth switch 194, and a fifth switch 195;

The third switch 193 is connected between the first sensing unit 1121 and a first connecting terminal 196, and the control logic circuit 18 is configured to control the first sensing unit 1121 to be connected with the first connecting terminal 196, or control the first sensing unit 1121 to be grounded through the third switch 193;

The fourth switch 194 is connected between the second sensing unit 1131 and the first connecting terminal 196, and the control logic circuit 18 is configured to control the second sensing unit 1131 to be connected with the first connecting terminal 196, or control the second sensing unit 1131 to be grounded through the fourth switch 194

The fifth switch 195 is connected between the first connecting terminal 196 and the differential detection circuit 13, and the control logic circuit 18 is configured to control the first connecting terminal 196 to be connected with the excitation circuit 17, or control the first connecting terminal 196 to be connected with the differential detection circuit 13 through the fifth switch 195.

When the fifth switch 195 connects the first connecting terminal 196 with the differential detection circuit 13, the third switch 193 can control the first sensing unit 1121 and the differential detection circuit 13 to be connected or disconnected, and the fourth switch 194 can control the second sensing unit 1131 and the differential detection circuit 13 to be connected or disconnected. When the fifth switch 195 connects the first connecting terminal 196 with the excitation circuit 17, the third switch 193 can control the first sensing unit 1121 and the excitation circuit 17 to be connected or disconnected, and the fourth switch 194 can control the second sensing unit 1131 and the excitation circuit 17 to be connected or disconnected.

It should be noted that the first connecting terminal 196 is only used to illustrate the connection relationship between the various elements of the circuit, and is not an element in an actual circuit.

Figure 11:
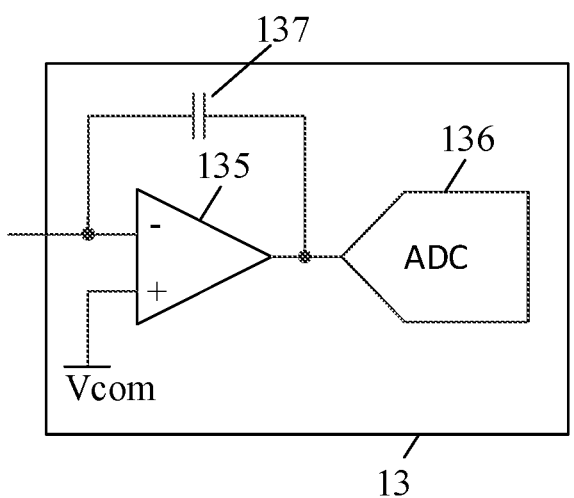
FIG. 11 is a schematic structural diagram of a differential detection circuit according to an embodiment of the present disclosure.

Optionally, in combination with the foregoing second implementation manner, as shown in FIG. 11, FIG. 11 is a schematic structural diagram of a differential detection circuit 13 according to an embodiment of the present disclosure. The differential detection circuit 13 includes a second operational amplifier 135, a second analog-to-digital converter (ADC) 136, and a third capacitor 137;

A positive input terminal of the second operational amplifier 135 is connected to a reference voltage, and a negative input terminal of the second operational amplifier 135 is electrically connected to the fifth switch 195;

The third capacitor 137 is connected between the negative input terminal of the second operational amplifier 135 and an output terminal of the second operational amplifier 135, and the output terminal of the second operational amplifier 135 is electrically connected to the second ADC 136.

The differential detection circuit 13 shown in FIG. 11 may be a pseudo differential detection circuit 13. In the charging phase, the fifth switch 195 connects the first connecting terminal 196 with the excitation circuit 17, and the third switch 193 and the fourth switch 194 are both connected with the first connecting terminal, that is, the sensing module 11 is connected with the excitation circuit 17. At this time, the excitation circuit 17 charges the capacitors (the ground capacitor of the first sensing unit 1121 and the ground capacitor of the second sensing unit 1131) of the sensing module 11. In the detection phase, the fifth switch 195 connects the first connecting terminal 196 with the differential detection circuit 13, the third switch 193 switches in the state of being connected with or disconnected from the first connecting terminal 196. One coding is achieved when the third switch 193 is connected with and disconnected from the first connecting terminal 196 once. Generally, the third switch 193 codes 10 times, and then the fourth switch 194 codes 10 times, to achieve alternate coding. Of course, they can also continuously code 20 times or more times to achieve alternate coding. The negative input terminal of the second operational amplifier 135 is connected to the first sensing unit 1121 or the second sensing unit 1131 in turn. When the negative input terminal of the second operational amplifier 135 is connected to the first sensing unit 1121, the second operational amplifier 135 outputs the difference between the voltage of the first detection electrical signal and the reference voltage. When the negative input terminal of the second operational amplifier 135 is connected to the second sensing unit 1131, the second operational amplifier 135 outputs the difference between the voltage of the second detection electrical signal and the reference voltage. The differences obtained twice are subtracted to obtain the voltage corresponding to the sensing capacitor.

In the embodiment of the present disclosure, the first sensing unit 1121 is arranged on the first sensing layer 112 of the capacitance detection apparatus 10, and the second sensing unit 1131 is arranged on the second sensing layer 113 of the capacitance detection apparatus 10. During detection, when the detection object approaches the capacitance detection apparatus 10, the capacitance of the first sensing unit 1121 is influenced by the temperature and the detection object, and the capacitance of the second sensing unit 1131 is only influenced by the temperature. Through the capacitances of the first sensing unit 1121 and the second sensing unit 1131, the influence of temperature can be eliminated, the change in capacitance caused by the detection object can be determined, and the detection accuracy of the capacitance detection apparatus 10 can be improved.

Embodiment 8

Figure 12:
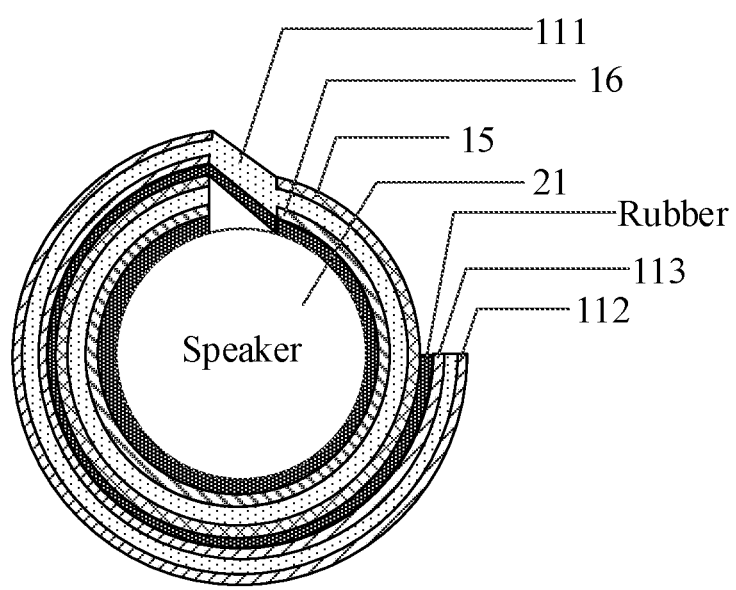
FIG. 12 is a schematic cross-sectional diagram of an electronic device according to an embodiment of the present disclosure.

An embodiment of the present disclosure provides an electronic device, as shown in FIG. 12, which is a schematic cross-sectional diagram of an electronic device according to an embodiment of the present disclosure. The electronic device includes the capacitance detection apparatus 10 described in any of the first to seventh embodiments.

Optionally, in an embodiment of the present disclosure, the electronic device is an earphone, and the sensing module 11 of the capacitance detection apparatus 10 is arranged around a speaker 21 of the earphone.

The first sensing layer 112 of the sensing module 11 is arranged on the side close to the user, and the second sensing layer 113 of the sensing module 11 is arranged on the side facing away from the user.

Optionally, in an embodiment of the present disclosure, the substrate 111 is formed into a laminated structure by encircling the speaker 21 twice.

Optionally, in an embodiment of the present disclosure, the length of the first sensing unit 1121 of the first sensing layer 112 and the length of the second sensing unit 1131 of the second sensing layer 113 are smaller than or equal to the perimeter of the speaker 21.

The lengths of the first sensing unit 1121 and the second sensing unit 1131 are smaller than or equal to the perimeter of the speaker 21, which can not only reduce the increase in thickness caused by the four-layer structure, but also expose the SHD of the inner layer for improving waterproofness.

Optionally, in an embodiment of the present disclosure, the third protection element 15 of the capacitance detection apparatus 10 is on the outside of the ground layer 16 of the capacitance detection apparatus 10, and the length of the ground layer 16 being surrounded by the third protection element 15 is the perimeter of the speaker 21.

The length of the third protection element 15 and the ground layer 16 can be the perimeter of the speaker 21, the ground layer 16 can shield digital interference generated by the speaker 21, and the third protection element 15 can reduce the influence of the ground layer 16 on the first sensing unit 1121 and/or the second sensing unit 1131.

In the sensing module 11 surrounding the speaker 21, the first sensing unit 1121 and the second sensing unit 1131 form a capacitor. In the charging phase, the excitation circuit 17 charges the capacitors (the ground capacitor of the first sensing unit 1121 and the ground capacitor of the second sensing unit 1131) of the sensing module 11. When the user wears the earphone, because the first sensing unit 1121 faces the human body, the ground capacitor of the first sensing unit 1121 approaches the human body, and because of the influence of temperature change, the magnitude of changes in capacitance. Thus, the ground capacitance of the first sensing unit 1121 contains base capacitance of the first sensing unit 1121, temperature drift capacitance affected by the temperature, and sensing capacitance generated by the proximity of the human body. The second sensing unit 1131 faces away from the human body, no sensing capacitance is generated due to the proximity of the human body, but the magnitude of capacitance is affected by the temperature change caused by the proximity of the human body, so the ground capacitance of the second sensing unit 1131 contains base capacitance of the second sensing unit 1131 and temperature drift capacitance affected by temperature. In the detection phase, due to the change of the capacitance, the amount of charges transferred from the capacitors in the sensing module 11 to the differential detection circuit 13 changes, resulting in a change in the output signal of the differential detection circuit 13. The output voltage generated by the charges transferred by the first sensing unit 1121 contains a voltage change caused by the temperature drift capacitance and a voltage change caused by the human body sensing capacitance. The output voltage generated by the charges transferred by the second sensing unit 1131 contains a voltage change caused by the temperature drift capacitance. The output voltage difference obtained by differential operation on the two output voltages is a voltage change caused by the sensing capacitance. Thus, the influence of temperature on sensor detection is reduced, and the detection accuracy is improved.

The electronic device according to the embodiment of the present disclosure exists in various forms, including but not limited to:

(1) A mobile communication device: This type of device has a mobile communication function, and has a main goal of providing voice and data communication. This type of terminal includes: a smart phone (such as iPhone), a multimedia phone, a functional phone, a low-end phone, etc.

(2) An ultra-mobile personal computer device: This type of device belongs to the category of personal computers, has computing and processing functions, and generally has mobile Internet access characteristics. This type of terminal includes: PDA, MID and UMPC devices, such as iPad.

(3) A portable entertainment device: This type of device can display and play multimedia contents. This type of device includes: an audio and video player (such as iPod), a hand-held game console, an e-book, as well as an intelligent toy and a portable vehicle navigation device.

(4) Other electronic devices with data interaction functions.

So far, specific embodiments of the present subject matter have been described. Other embodiments fall within the scope of the appended claims. In some cases, the operations described in the claims may be performed in a different order and still achieve the desired results. In addition, the processes described in the drawings do not necessarily require a particular order shown or a sequential order to achieve the desired results. In some embodiments, multitasking and parallel processing may be advantageous.

It should also be noted that the terms "first", "second", etc. (if any) in the description and claims of the present disclosure and the above-mentioned drawings are used to distinguish similar objects, and are not necessarily used to describe a specific order or precedence. It should be appreciated that the data used in this way may be interchanged under appropriate circumstances, so that the embodiments of the present disclosure described herein, for example, can be implemented in a sequence other than those illustrated or described here. In addition, the terms "include", "contain", or any other variants thereof are intended to cover non-exclusive inclusion, so that a process, method, commodity or device including a series of elements not only includes these elements, but also includes those that are not explicitly listed, or further includes elements inherent to this process, method, commodity or device. In the absence of more limitations, an element limited by "include a . . . " does not exclude other same elements existing in the process, method, commodity, or device including the element.

Described above are merely embodiments of the present disclosure, and the present disclosure is not limited thereto. Various modifications and variations may be made to the present disclosure for those skilled in the art. Any modification, equivalent substitution, improvement or the like made within the spirit and principle of the present disclosure shall fall into the scope of the claims of the present disclosure.

What is claimed is:

1. A capacitance detection apparatus, comprising: a sensing module, a connecting circuit, and a differential detection circuit configured to detect changes in capacitance of the sensing module;
   the sensing module comprising: a substrate, and a first sensing layer and a second sensing layer respectively located on two sides of the substrate,
   a first sensing unit of the first sensing layer is opposite to a second sensing unit of the second sensing layer;
   the first sensing unit and the second sensing unit are electrically connected to the differential detection circuit through the connecting circuit, respectively,
   wherein the capacitance detection apparatus further comprises an excitation circuit, the first sensing unit and the second sensing unit are electrically connected with the excitation circuit through the connecting circuit respectively, and the excitation circuit is configured to transmit electrical signals to the first sensing unit and the second sensing unit.

2. The capacitance detection apparatus according to claim 1, wherein
   the first sensing unit comprises a first pattern, the second sensing unit comprises a second pattern, and the first pattern and the second pattern are in the same shape.

3. The capacitance detection apparatus according to claim 2, wherein
   the first pattern and the second pattern are both grid patterns, a grid size of the first pattern is same as a grid size of the second pattern, or the grids of the second pattern are sparser than the grids of the first pattern.

4. The capacitance detection apparatus according to claim 1, wherein the first sensing layer is provided with a first ground pattern, and/or the second sensing layer is provided with a second ground pattern.

5. The capacitance detection apparatus according to claim 4, wherein the connecting circuit comprises a connector, and the connector comprises a first connecting point, a second connecting point, and a ground point;
   the first sensing unit is electrically connected to the differential detection circuit through the first connecting point, and the second sensing unit is electrically connected to the differential detection circuit through the second connecting point;
   the first ground pattern is electrically connected to the ground point, and/or the second ground pattern is electrically connected to the ground point.

6. The capacitance detection apparatus according to any one of claim 1, wherein the first sensing layer further comprises a first protection element, the second sensing layer further comprises a second protection element, and the first protection element and the second protection element are both conductive media;
   the first protection element is not in contact with the first sensing unit, and the second protection element is not in contact with the second sensing unit.

7. The capacitance detection apparatus according to claim 6, wherein the first protection element is arranged around the first sensing unit of the first sensing layer, and the second protection element is arranged around the second sensing unit of the second sensing layer.

8. The capacitance detection apparatus according to claim 6, wherein the first protection element and the second protection element are opposite to each other, and are of a same size and shape.

9. The capacitance detection apparatus according to claim 1, wherein the capacitance detection apparatus further comprises a third protection element, cross sections of the first sensing layer, the second sensing layer and the third protection element are annular, and the third protection element is fixed inside of the second sensing layer.

10. The capacitance detection apparatus according to claim 9, wherein the capacitance detection apparatus further comprises a ground layer;
    a cross section of the substrate is spiral, a part of the substrate that is close to an inner side of the spiral is between the third protection element and the ground layer, and a part of the substrate that is close to an outer side of the spiral is between the first sensing layer and the second sensing layer.

11. The capacitance detection apparatus according to claim 1, wherein the capacitance detection apparatus further comprises a control logic circuit and a switch module;
    the first sensing unit and the second sensing unit are electrically connected to the switch module through the connecting circuit respectively, and the switch module is electrically connected to the excitation circuit and the differential detection circuit respectively;
    the control logic circuit is electrically connected to the switch module, and the control logic circuit is configured to control a turn-on or turn-off of the switch module.

12. The capacitance detection apparatus according to claim 11, wherein the switch module comprises a first switch and a second switch;
    the first switch is connected between the first sensing unit and the differential detection circuit, and the control logic circuit is configured to control the first sensing unit to be connected with the excitation circuit, or control the first sensing unit to be connected with the differential detection circuit through the first switch;
    the second switch is connected between the second sensing unit and the differential detection circuit, and the control logic circuit is configured to control the second sensing unit to be connected with the excitation circuit, or control the second sensing unit to be connected with the differential detection circuit through the second switch.

13. The capacitance detection apparatus according to claim 12, wherein the differential detection circuit comprises a first operational amplifier, a first analog-to-digital converter, a first capacitor, and a second capacitor;
    a positive input terminal of the first operational amplifier is electrically connected to the first switch, and a negative input terminal of the first operational amplifier is electrically connected to the second switch;

the first capacitor is connected between the positive input terminal of the first operational amplifier and an output terminal of the first operational amplifier, the second capacitor is connected between the negative input terminal of the first operational amplifier and the output terminal of the first operational amplifier, and the output terminal of the first operational amplifier is electrically connected to the first analog-to-digital converter.

14. The capacitance detection apparatus according to claim 11, wherein the switch module comprises a third switch, a fourth switch, and a fifth switch;
    the third switch is connected between the first sensing unit and a first connecting terminal, and the control logic circuit is configured to control the first sensing unit to be connected with the first connecting terminal, or control the first sensing unit to be grounded through the third switch;
    the fourth switch is connected between the second sensing unit and the first connecting terminal, and the control logic circuit is configured to control the second sensing unit to be connected with the first connecting terminal, or control the second sensing unit to be grounded through the fourth switch;
    the fifth switch is connected between the first connecting terminal and the differential detection circuit, and the control logic circuit is configured to control the first connecting terminal to be connected with the excitation circuit, or control the first connecting terminal to be connected with the differential detection circuit through the fifth switch.

15. The capacitance detection apparatus according to claim 14, wherein the differential detection circuit comprises a second operational amplifier, a second analog-to-digital converter, and a third capacitor;
    a positive input terminal of the second operational amplifier is connected to a reference voltage, and a negative input terminal of the second operational amplifier is electrically connected to the fifth switch;
    the third capacitor is connected between the negative input terminal of the second operational amplifier and an output terminal of the second operational amplifier, and the output terminal of the second operational amplifier is electrically connected with the second analog-to-digital converter.

16. An electronic device, comprising a capacitance detection apparatus,
    the capacitance detection apparatus comprises:
    a sensing module, a connecting circuit, and a differential detection circuit configured to detect changes in capacitance of the sensing module;
    the sensing module comprising: a substrate, and a first sensing layer and a second sensing layer respectively located on two sides of the substrate,
    a first sensing unit of the first sensing layer is opposite to a second sensing unit of the second sensing layer;
    the first sensing unit and the second sensing unit are electrically connected to the differential detection circuit through the connecting circuit, respectively,
    wherein the electronic device is an earphone, and a sensing module of the capacitance detection apparatus is arranged around a speaker of the earphone;
    a first sensing layer of the sensing module is arranged on a side close to a user, and a second sensing layer of the sensing module is arranged on a side facing away from the user.

17. The electronic device according to claim 16, wherein a length of a first sensing unit of the first sensing layer and a length of a second sensing unit of the second sensing layer are smaller than or equal to a perimeter of the speaker.

18. The electronic device according to claim 16, wherein a third protection element of the capacitance detection apparatus is on the outside of a ground layer of the capacitance detection apparatus, and a length of the ground layer being surrounded by the third protection element is a perimeter of the speaker.

* * * * *